(12) United States Patent
Otsuka et al.

(10) Patent No.: US 11,854,639 B2
(45) Date of Patent: Dec. 26, 2023

(54) TEST CIRCUIT IN SCRIBE REGION FOR MEMORY FAILURE ANALYSIS

(71) Applicant: MICRON TECHNOLOGY, INC., Boise, ID (US)

(72) Inventors: Atsuko Otsuka, Hiroshima (JP); Takeshi Kaku, Hiroshima (JP); Soeparto Tandjoeng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/719,327

(22) Filed: Apr. 12, 2022

(65) Prior Publication Data

US 2023/0326540 A1    Oct. 12, 2023

(51) Int. Cl.
*G11C 29/18* (2006.01)
*G11C 29/12* (2006.01)
*G11C 29/46* (2006.01)

(52) U.S. Cl.
CPC .......... *G11C 29/18* (2013.01); *G11C 29/1201* (2013.01); *G11C 29/46* (2013.01); *G11C 2029/1802* (2013.01)

(58) Field of Classification Search
CPC ..... G11C 29/18; G11C 29/1201; G11C 29/46; G11C 2029/1802
See application file for complete search history.

(56) References Cited

U.S. PATENT DOCUMENTS

| | | | |
|---|---|---|---|
| 2007/0244593 A1* | 10/2007 | Kinoshita | H01L 22/34 257/E21.525 |
| 2008/0238453 A1* | 10/2008 | Lo | G01R 31/2884 324/754.07 |
| 2017/0170081 A1* | 6/2017 | Byun | G01R 31/31713 |

* cited by examiner

*Primary Examiner* — Mohammed A Bashar
(74) *Attorney, Agent, or Firm* — Dorsey & Whitney LLP

(57) ABSTRACT

Apparatuses and methods including a test circuit in a scribe region between chips are described. An example apparatus includes: a first semiconductor chip and a second semiconductor chip, adjacent to one another; a scribe region between the first and second semiconductor chips; test address pads in the scribe region; and an address decoder circuit in the scribe region. The test address pads receive address signals. The address decoder provides first signals responsive to the address signals from the test address pads.

24 Claims, 6 Drawing Sheets

TEST CIRCUIT IN SCRIBE REGION FOR MEMORY FAILURE ANALYSIS

BACKGROUND

High data reliability, high speed memory access, lower power consumption and reduced chip size are features that are demanded from semiconductor devices. To achieve reduced chip size and high data reliability, accurate fabrication of the semiconductor devices has been desired.

To detect defects in memory cell arrays, a model memory cell array that is smaller than a memory cell array in each chip can be provided in a scribe region between adjacent chips. Pads to access the model memory cell array are also provided in the scribe region. Because of a limited space in the scribe region, a limited number of pads to access the model memory cell array may be included. For example, if the number of pads is N (that is a natural number), every Nth address lines coupled to the model memory cell array are accessed simultaneously. An electrically defective address line may be detected using light emission analysis. The light emission analysis may not be able to detect the defective line when activated address lines including the defective address line are too close (e.g., N is a lower number), due to the relatively low resolution of the light emission analysis. In order to identify a defective address line while maintaining a lower number of address pads, an alternative technique to access the address lines may be desired.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
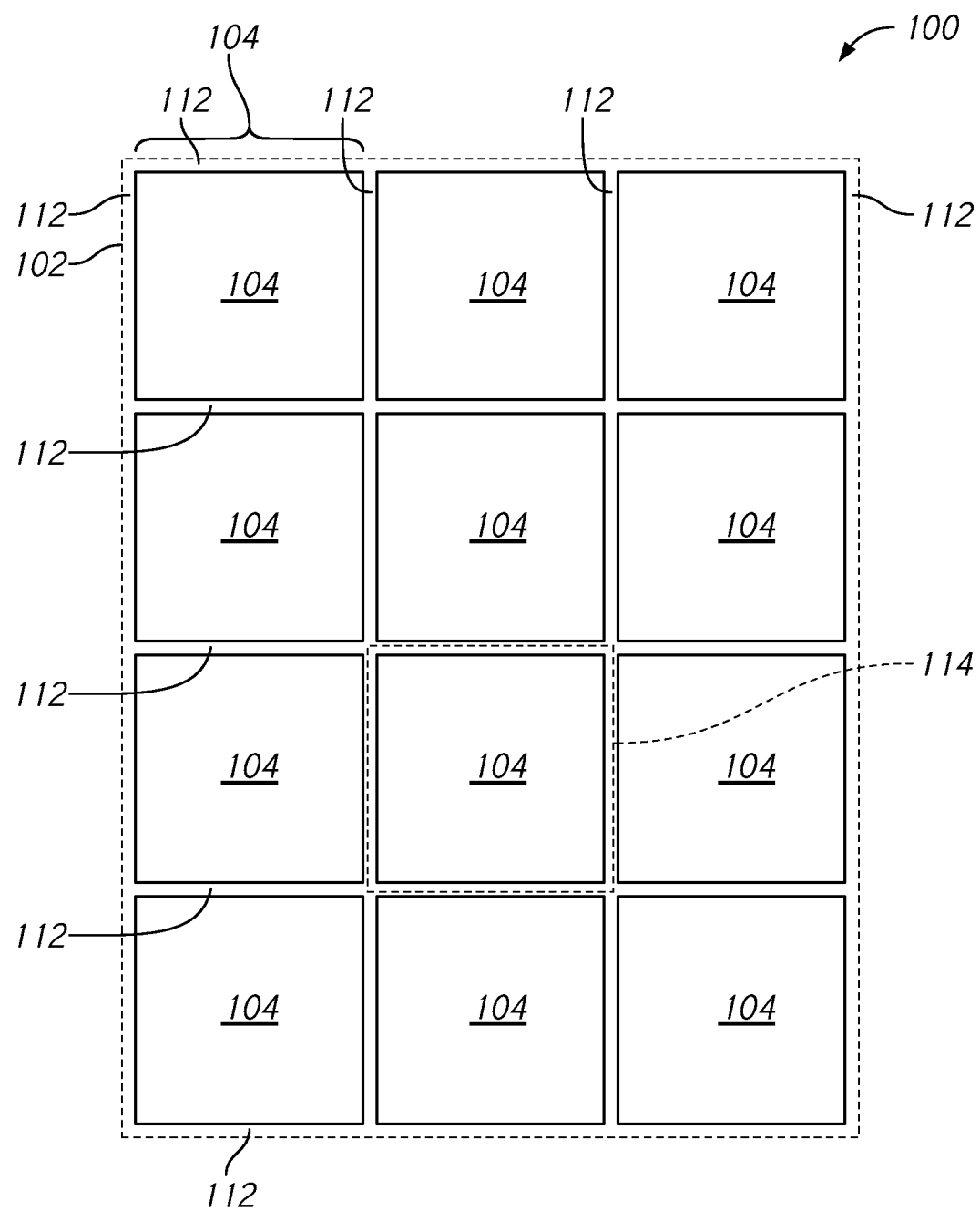
FIG. 1 is a layout diagram of a semiconductor device including a plurality of semiconductor chips in accordance with an embodiment of the present disclosure.

FIG. 1 is a layout diagram for of a plurality of semiconductor chips 104 included in a semiconductor device 100 in accordance with an embodiment of the present disclosure. FIG. 1 is a plan view illustrating a schematic configuration of a layout of the plurality of semiconductor chips 104 and a scribe region 112 formed on the semiconductor device 100. In some embodiments, the semiconductor device 100 may be a wafer. In some embodiments, the plurality of semiconductor chips 104 may be disposed in a matrix and each chip 104 may have a rectangular shape. Each semiconductor chip 104 may include transistors and circuit components. The transistors and the circuit components may include one or more memory arrays. The one or more memory arrays include a plurality of memory access transistors which are configured to be included in a plurality of memory cells. The transistors and the circuit components may also include one or more circuits coupled to the plurality of memory access transistors. For example, the one or more circuits may include row drivers, sense amplifiers and address decoders. The one or more circuits may provide memory access functions, such as read operations and write operations to the memory cells. The transistors and the circuit components may also include a control circuit that controls the circuits.

The scribe region 112 may be disposed around each semiconductor chip 104.

In some embodiments, the scribe region 112 may include test circuits, including one or more test memory arrays and test address decoder circuits that provide access to the one or more test memory arrays. In some embodiments, a dicing line may be defined in the scribe region 112 for separating the semiconductor device 100, such as a wafer into individual semiconductor chips 104.

In some embodiments, separating the semiconductor device 100 in FIG. 1 into chips 104 may be performed by a dicing step. The dicing step may be performed along a dicing line in the scribe region 112. In some embodiments, stealth laser dicing may be performed. In some embodiments, blade dicing may be performed. The semiconductor wafer 100 may include portions 114. Each of the portions 114 may include one of the plurality of semiconductor chips 104 and a scribe region 112 around the semiconductor chip 104.

Figure 2:
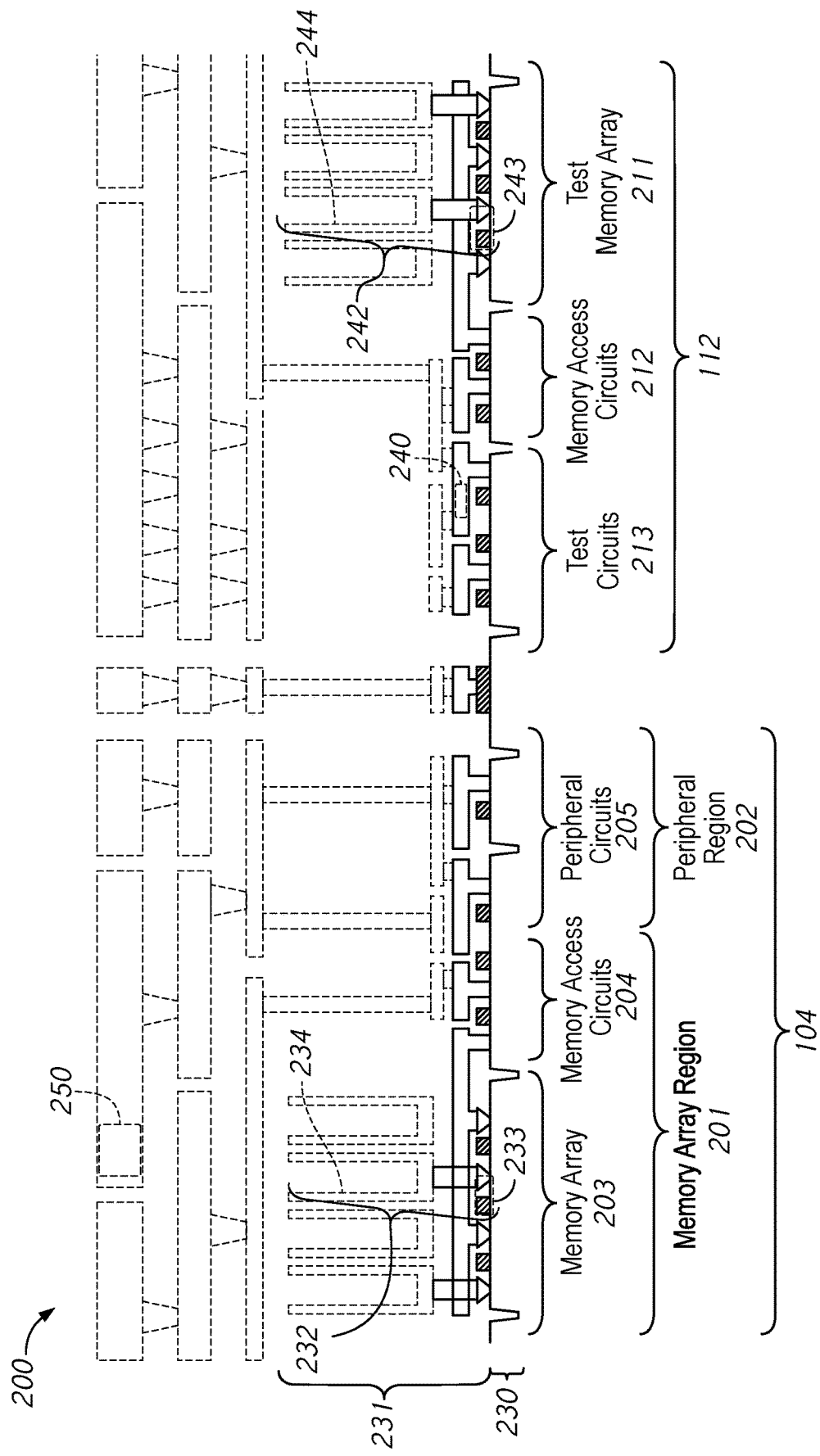
FIG. 2 is a vertical cross-sectional view of a structure in a semiconductor device in accordance with an embodiment of the present disclosure.

FIG. 2 is a vertical cross-sectional view of a structure 200 in a semiconductor device in accordance with an embodiment of the present disclosure. In some embodiments, the structure 200 may be included in the portion 114 of FIG. 1. The structure 200 includes a semiconductor chip 104 and a scribe region 112. The semiconductor chip 104 may include a memory array region 201 and a peripheral region 202. The following description uses a dynamic random-access memory (DRAM) as an illustrative example of the semiconductor chip 104. The structure 200 may include a portion 231 fabricated in a front-end-of-line (FEOL) above a substrate 230.

The semiconductor chip 104 of portion 231 fabricated in the FEOL includes memory arrays 203 in the memory array region 201. A memory array 203 may include partial memory cells 232 on the substrate 230. For example, each of the partial memory cells 232 may include a memory access transistor 233 but no capacitor. FIG. 2 shows memory cell capacitors 234 for reference (e.g., dashed line), but are optional for embodiments of the disclosure. The memory array region 201 may include memory access circuits 204. The memory access circuits 204 may be disposed adjacent to the memory arrays 203. In some embodiments, the memory access circuits 204 may include row drivers and a portion of sense amplifiers to be formed with memory access transistors 233. In some embodiments, peripheral circuits 205 may be disposed in the peripheral region 202. The peripheral circuits 205 may include, for example, a timing control circuits, address and command decoder circuits, a data input/output circuit, etc.

The scribe region 112 of portion 231 fabricated in the FEOL includes test memory arrays 211, memory access circuits 212 and test circuits 213. A test memory array 211 may include memory cells 242 on the substrate 230. Each of the memory cells 242 may include a memory access transistor 243 and a capacitor 244 coupled to the memory access transistor 243. In some embodiments, the memory access transistor 243 is disposed on the substrate 230, and the capacitor 244 is above the memory access transistor 243. In some embodiments, the memory access circuits 212 may be disposed adjacent to the test memory array 211. In some embodiments, the test circuits 213 may include test address decoder circuits and other circuits for electrical characteristics tests. In some embodiments, the memory access circuits 212 and the test circuits 213 may be formed concurrently with memory access transistors 243. The scribe region 112 may also include power pads that may receive power supply voltages and provide the power supply voltages throughout the scribe region 112 and to the semiconductor chip 104. The scribe region 112 may also include test voltage pads, test command pads and test address pads 240 that may receive test voltages, test command signals and test address signals. In some embodiments, the power pads, the test voltage pads, the test command pads and the test address pads 240 may be included in a wiring layer.

The test address decoder circuits in the test circuits 213 may decode the test address signals received at the test address pads, and activate one or more address lines responsive to a decoding result of the test address signals by applying a voltage corresponding to the test voltage at a timing responsive to the test command signal. The one or more address lines may be coupled to the memory access circuits 212 coupled to the test memory array 211.

Electrical characteristics of the test memory arrays 211, including the memory access transistors 243 and the address lines coupled to the memory access transistors 243 may be analyzed by including the test memory arrays 211, the memory access circuits 212 and the test circuits 213. For example, by providing test voltages on address lines coupled to the memory access transistors 243, emission analysis may be performed to detect, for example, locations of leak currents in proximity to the address lines and the memory access transistors 243. Electrical characteristics of the test memory arrays 211 may be tested and analyzed without forming capacitors 234 and 244 of memory cells, a back-end-of-line (BEOL) above the capacitors 234 and 244 and/or a back end above the BEOL including address pads 250 for identifying an address of a memory cell to be accessed in the memory arrays 211. In some embodiments, the back end may include a wiring layer, and the address pads 250 may be disposed on the wiring layer.

Figure 3:
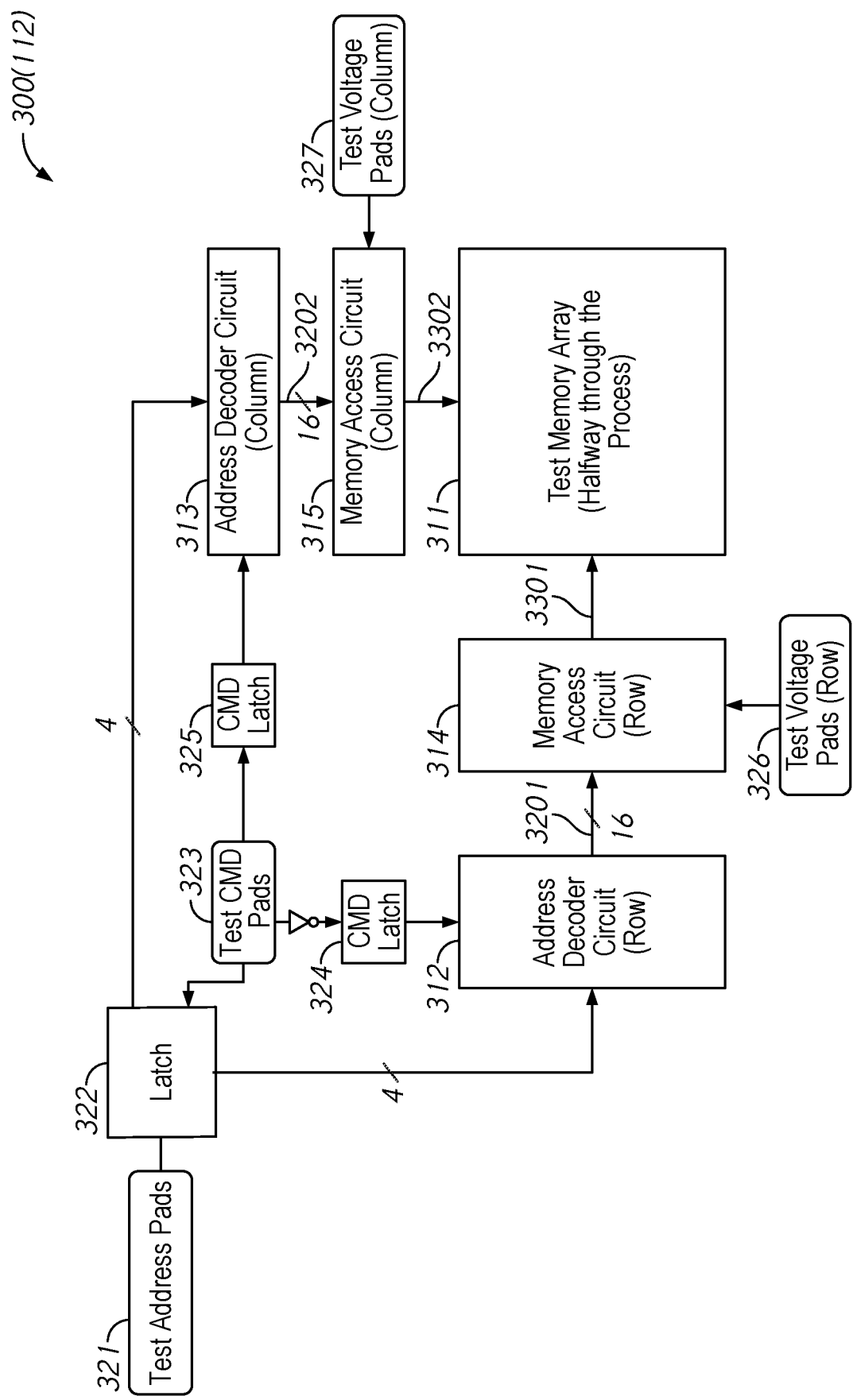
FIG. 3 is a schematic diagram of circuits included in a scribe region in a semiconductor device in accordance with an embodiment of the present disclosure.

FIG. 3 is a schematic diagram of circuits included in a scribe region 300 in a semiconductor device in accordance with an embodiment of the present disclosure. In some embodiments, the scribe region 300 may be included in the scribe region 112 of FIGS. 1-2.

The scribe region 300 includes test memory arrays 311, memory access circuits 314 and 315, and address decoder circuits 312 and 313. The scribe region 300 may also include test address pads 321, an address latch 322, test command pads 323, command latches 324 and 325, and test voltage pads 326 and 327. In some embodiments, the test memory arrays 311 may include the test memory arrays 211 of FIG. 2. A test memory array 311 may include memory access transistors, such as memory access transistors 243 of FIG. 2. In some embodiments, the memory access circuits 314 and 315 may include memory access circuits 212 of FIG. 2. In some embodiments, memory access circuits 314 and 315 may be disposed adjacent to the test memory arrays 311.

The test command pads 323 may receive test command signals that control the timings of when address signals are received (e.g., row address signals or column address signals). The test command pads 323 may be coupled to the address latches 322. The test command pads 323 may also be coupled to the command latches 324 through inverters and to the command latch 325. Thus, the command latches 324 may receive complementary signals of the test command signals and the command latches 325 may receive the test command signals. The command latches 324 may provide test row command signals responsive to the complementary signals of the test command signals and the command latches 325 may provide test column command signals responsive to the test command signals. For example, in a normal operation, the test command signals provided to the test command pads 323 are in an active state (e.g., active high logic level), the command latches 324 may provide the test row command signals in an inactive state (e.g., inactive low logic level), whereas the command latches 325 may provide the test column command signals in an active state (e.g., active high logic level). Conversely, when the test command signals provided to the test command pads 323 are in an inactive state (e.g., inactive low logic level), the command latch 324 may provide the test row command signals in an active state (e.g., active high logic level), whereas the command latches 325 may provide the test column command signals in an inactive state (e.g., inactive low logic level).

In some embodiments, the test command pads 323 may include a group of command pads that provide signals indicative of latching timings of address signals. For example, two rows and two columns may be activated to reach forced intended voltages during failure analysis tests. The group of command pads may further indicate whether the current address signals to be latched are indicative of row address or column address. For example, in a normal operation, rows may be activated, and then columns may be activated. After activating the rows and columns, the test memory arrays 311 may be activated. The rows and the columns are activated by applying a test voltage, at either logic high or logic low level, to check if there is any defect (e.g., short circuit) in the test memory arrays 311.

In some embodiments, the test command pads 323 may include a group of command pads that provide signals indicative of a special test operation by controlling row address activation and/or by controlling column address activation to perform an initial failure analysis. For example, all rows may be activated while either of even/odd columns are at either logic high or logic low level to find if there is a potential leakage. In this initial failure analysis, whether there is a defect may be tested. Alternatively, another special test condition may be set by the signals of the group of command pads to detect different types of defects.

While above description included two groups of command pads, the two groups of command pads may cooperate or function independently. For example, the groups of command pads for normal operation may indicate row and column addresses; however, the groups of command pads may override controlling the row and/or column address signals for the special test operation.

The test address pads 321 may receive test address signals, with each test address pad receiving a respective one of the test address signals. In some embodiments, the test address pads 321 may be used for receiving a set of row addresses and column addresses. The address latches 322 may receive the test address signals from the test address pads 321. The address latches 322 may provide the test address signals to the address decoder circuits 312 and 313, responsive to the test command signal from the test command pad 323.

The address decoder circuit 312 may receive the test address signals latched by the address latches 322. The address decoder circuit 312 may decode the test address signals responsive to the active state of the test row command signal. As previously described, for the present example, the test address signals include four signals. However, in other embodiments disclosure, the test address signals may include greater or fewer signals. The address decoder circuit 312 may be coupled to row address control lines 3201. The address decoder circuit 312 may activate one of the row address control lines 3201 responsive to the decoding result of the address signals. The address decoder circuit 312 may further include a voltage shifter circuit that may adjust a voltage of a row address control line 3201 to be activated. A number of the row address control lines 3201 is greater than the number of the test address signals. For example, where the test address signals include four signals, a number of the row address control lines 3201 is sixteen. In other embodiments of the disclosure, the row address control lines 3201 may include greater or fewer control lines.

The test voltage pad 326 may receive a test voltage to be applied on one of row address lines 3301 coupled to the test memory arrays 311. In some embodiments of the disclosure, the address lines 3301 may include a corresponding number of lines to the row address control lines 3201. The test voltage may be used to detect a location of a leak current or testing some other electrical characteristic of circuits within the test memory arrays 311. The test voltage may have a magnitude appropriate to meet a purpose of a test. In some examples, the test voltage may range from a power supply voltage VSS at a ground level to a positive power supply voltage VDD. In other examples, the test voltage may range from a negative power supply voltage that is lower than the ground level to a positive power supply voltage that is higher than the positive power supply voltage VDD.

In some embodiments, the memory access circuit 314 may receive the test voltage from the test voltage pad 326. The memory access circuit 314 may be coupled to the row address control lines 3201. The memory access circuit 314 may also be coupled to the row address lines 3301. The memory access circuit 314 may provide the test voltage to one of the row address lines 3301 coupled to the test memory arrays 311 responsive to an active state of a corresponding row address control line 3201. In some embodiments, the memory access circuit 314 may be a multiplexer. In some embodiments, each row address line 3301 may be coupled to several internal row address lines in the test memory arrays 311. For example, when the scribe region 300 includes sixteen row address lines 3301, each row address line 3301 may be coupled to every sixteenth internal row address lines in the test memory arrays 311. Thus, by activating one row address line 3301, one of every sixteen internal row address lines are activated. Each internal row address line may be coupled to a corresponding memory access transistor.

The address decoder circuit 313 may receive the test address signals latched by the address latch 322. The address decoder circuit 313 may decode the test address signals responsive to the active state of the test column command signal. As previously described, for the present example, the test address signals include four signals. However, in other embodiments disclosure, the test address signals may include greater or fewer signals. The address decoder circuit 313 may be coupled to column address control lines 3202. The address decoder circuit 313 may activate one of the column address lines 3202 responsive to the decoding result of the address signals. A number of the column address control lines 3202 is greater than the number of the test address signals. For example, where the test address signals include four signals, a number of the column address 3202 lines is sixteen. In other embodiments of the disclosure, the column address control lines 3202 may include greater or fewer control lines.

The test voltage pad 327 may receive a test voltage to be applied on one of column address lines 3302 coupled to the test memory arrays 311. In some embodiments of the disclosure, the column address lines 3302 may include a corresponding number of lines to the column address control lines 3202. The test voltage may be used to detect if there is a leak current or testing some other electrical characteristic of circuits within the test memory arrays 311. The test voltage may have a magnitude appropriate to meet a purpose of a test. For example, the test voltage may range from a negative power supply voltage VSS to a positive power supply voltage VDD.

In some embodiments, the memory access circuit 315 may receive the test voltage from the test voltage pad 327. The memory access circuit 315 may be coupled to the column address control lines 3202. The memory access circuit 315 may also be coupled to the column address lines 3302. The memory access circuit 315 may provide the test voltage to one of the column address lines 3302 coupled to the test memory arrays 311 responsive to an active state of a corresponding column address control lines 3202. In some embodiments, the memory access circuit 315 may be a multiplexer. In some embodiments, each column address line 3302 may be coupled to several internal column address lines in the test memory arrays 311. For example, when the scribe region 300 includes sixteen column address lines 3302, each column address line 3302 of the sixteen column address lines 3302 may be coupled to every sixteenth internal column address lines in the test memory arrays 311. Thus, by activating one column address line 3302, one of every sixteen internal column address lines are activated. Each internal column address line may be coupled to a corresponding memory access transistor.

A number of address lines coupled to a test memory array may be greater (e.g., $2^N$ lines where N is a natural number) than a number of address lines (e.g., N lines) coupled to test address pads (e.g., N address pads). An emission analysis of address lines by activation of every $2^N$th address lines coupled to address decoder circuits may identify a defective address line which may not be identified by an emission analysis of address lines by activation of every Nth address lines directly coupled to test address pads. A defective address line in a test memory array may be detected by an emission analysis by including address decoder circuits and a relatively lower number of test address pads in an FEOL of the scribe region, without providing a capacitor of a memory cell and a BEOL.

Figure 4:
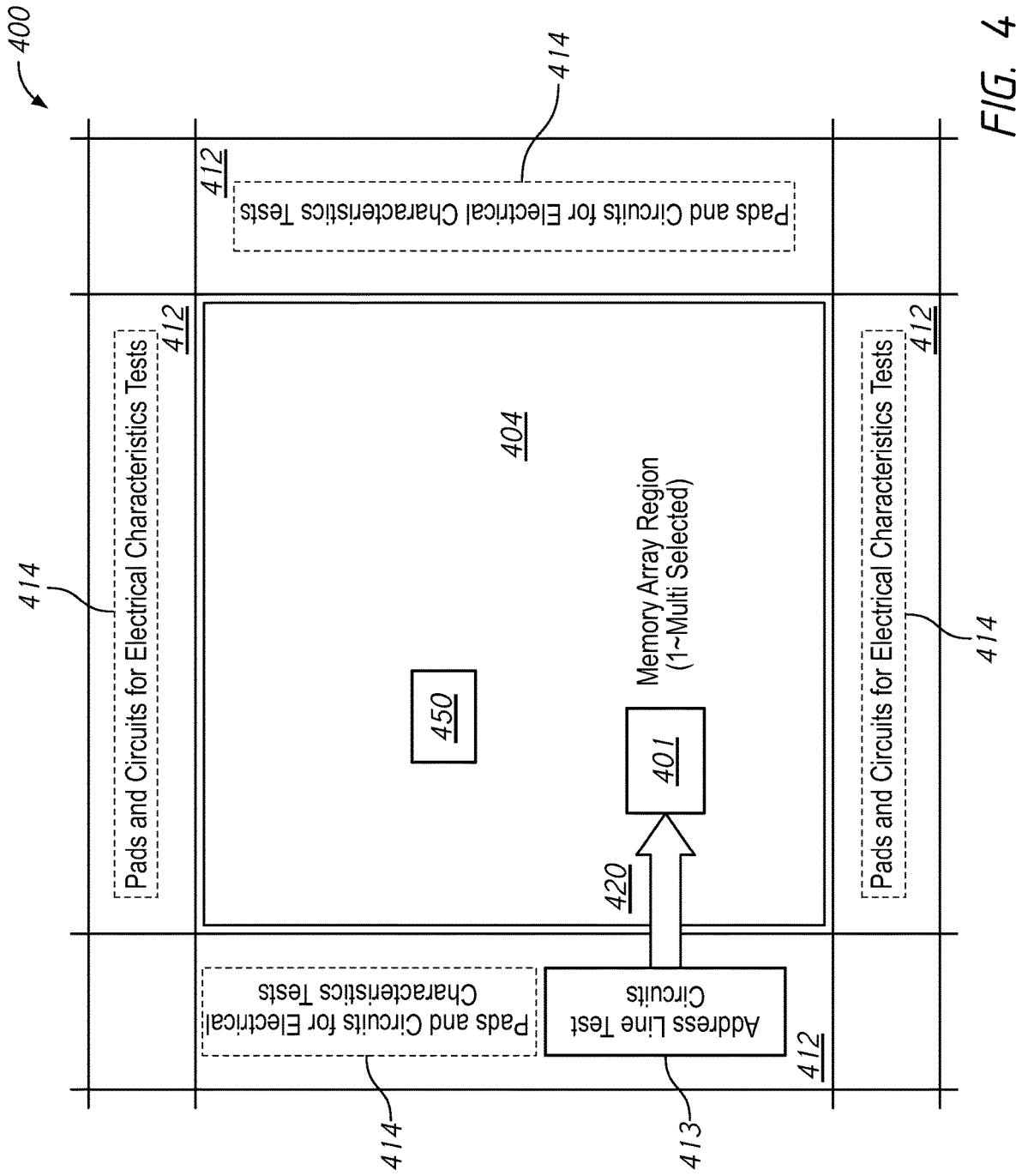
FIG. 4 is a layout diagram of a semiconductor device including a semiconductor chip and scribe regions in accordance with an embodiment of the present disclosure.

FIG. 4 is a layout diagram of a semiconductor device 400 including a semiconductor chip 404 and scribe regions 412 in accordance with an embodiment of the present disclosure. FIG. 4 is a plan view illustrating a schematic configuration of a layout of the plurality of semiconductor chips 404 and scribe regions 412 formed on the semiconductor device 400. In some embodiments, the semiconductor device 400 may be a portion 114 of FIG. 1. Each semiconductor chip 404 may include a memory array region 401 including transistors and circuit components. The memory array region 401 includes a plurality of memory access transistors which are configured to be included in a plurality of memory cells. The transistors and the circuit components may also include memory access circuits coupled to the plurality of memory access transistors. For example, the memory access circuits may include row drivers and sense amplifiers. The memory access circuits may provide access to the plurality of memory access transistors. The transistors and the circuit components may also include a control circuit that controls the memory access circuits. Each semiconductor chip 404 may include address pads 450 for identifying an address of a memory cell to be accessed in the memory array region 401.

Figure 5:
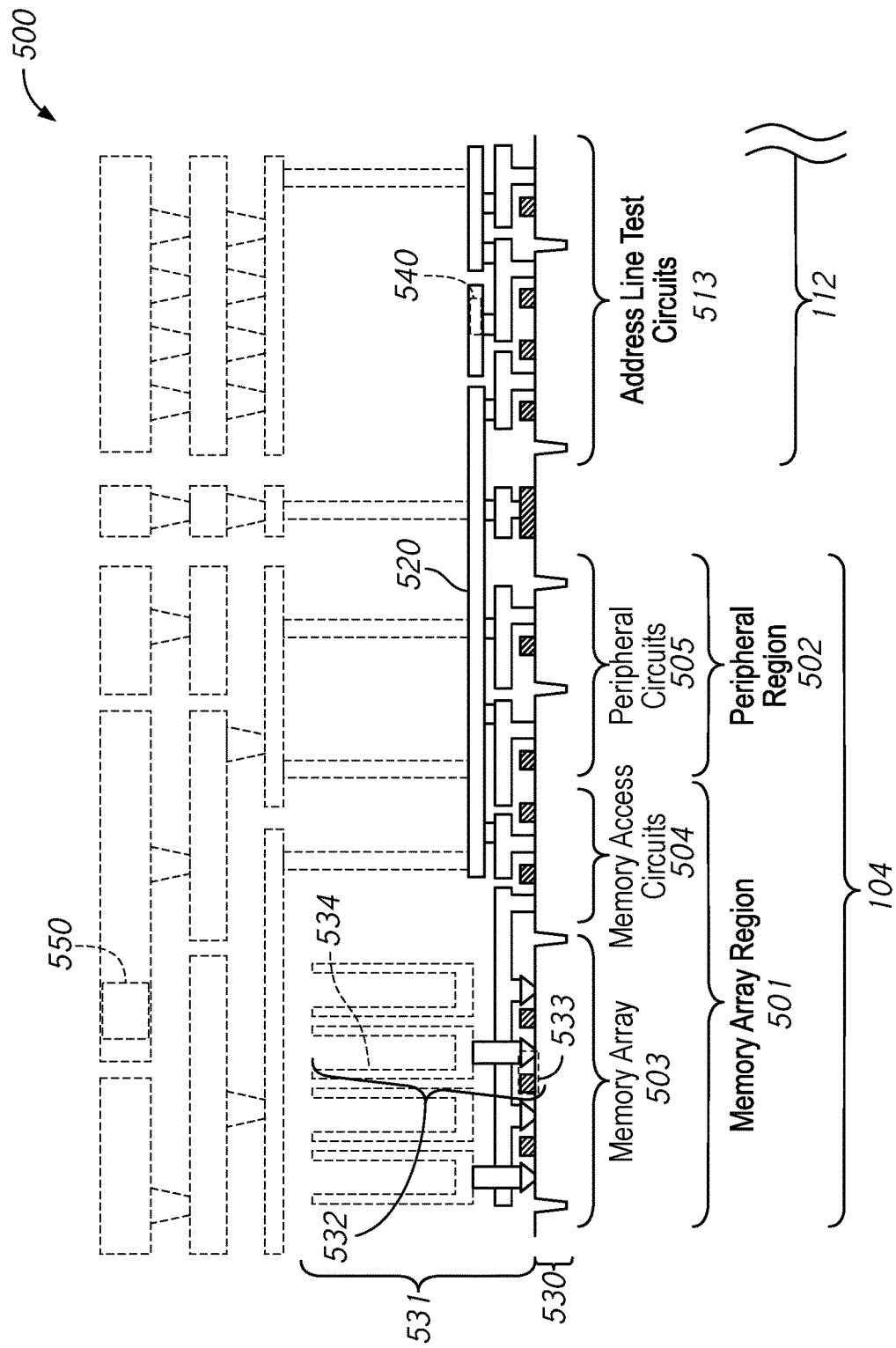
FIG. 5 is a vertical cross-sectional view of a structure in a semiconductor device in accordance with an embodiment of the present disclosure.

The scribe region 412 may be disposed around the semiconductor chip 404. In some embodiments, the scribe region 412 may include address line test circuits 413. The address line test circuits include test address pads and test address decoder circuits. The test address decoder circuits may decode test address signals received at the test address pads, and activate one or more address control lines 420. The one or more address control lines 420 may be coupled to the memory access circuits in the memory array region 401. Structures and functionalities of the test address decoder circuits, the one or more address control lines 420 and the memory access will be discussed in details with reference to FIGS. 5 and 6. The one or more address control lines 420 may be formed as a conductive layer above the address line test circuits 413, the memory access circuits and the plurality of memory access transistors in the memory array region 401. The conductive layer 420 may couple the address line test circuits 413 in the scribe region 412, the memory access circuits, such as row drivers. In some embodiments, the scribe region 412 may also include pads and circuits for electrical characteristics tests 414. FIG. 5 is a vertical cross-sectional view of a structure 500 in a semiconductor device in accordance with an embodiment of the present disclosure. In some embodiments, the structure 500 may be included in the portion 114 of FIG. 1. The structure 500 includes a semiconductor chip 104 and a scribe region 112. The semiconductor chip 104 may include a memory array region 501 and a peripheral region 502. The following description uses a dynamic random-access memory (DRAM) as an illustrative example of the semiconductor chip 104. The structure 500 may include a portion 531 fabricated in a front-end-of-line (FEOL) above a substrate 530.

The semiconductor chip 104 of portion 531 fabricated in the FEOL includes memory arrays 503 in the memory array region 501. A memory array 503 may include partial memory cells 532 on the substrate 530. For example, each of the partial memory cells 532 may include a memory access transistor 533 but no capacitor. FIG. 5 shows memory cell capacitors 534 for reference (e.g., dashed line), but are optional for embodiments of the disclosure. The memory array region 501 may include memory access circuits 504. The memory access circuits 504 may be disposed adjacent to the memory arrays 503. In some embodiments, the memory access circuits 504 may include row drivers and a portion of sense amplifiers to be formed with the memory access transistors 533. In some embodiments, peripheral circuits 505 may be disposed in the peripheral region 502. The peripheral circuits 505 may include, for example, a timing control circuits, address and command decoder circuits, a data input/output circuit, etc.

The scribe region 112 of the portion 531 fabricated in the FEOL includes address line test circuits 513. In some embodiments, the address line test circuits 513 may include test address decoder circuits and other circuits for electrical characteristics tests. In some embodiments, the address line test circuits 513 may be formed concurrently with the memory access transistors 533. The scribe region 112 may also include power pads that receive power supply voltages and provide the power supply voltages throughout the scribe region 112 and the semiconductor chip 104. The scribe region 112 may also include test voltage pads, test command pads and test address pads 540 that may receive test voltages, test command signals and test address signals. In some embodiments, the power pads, the test voltage pads, the test command pads and the test address pads 540 may be included in a wiring layer. The structure 500 may also include address control lines 520. Each of the address control lines 520 has one end coupled to one of the address line test circuits 513 (e.g., the test address decoder circuits) in the scribe region 112 and another end coupled to one of the memory access circuits 504 (e.g., one of the row drivers and sense amplifiers) in the memory array region 501 of the semiconductor chip 104. The address control lines 520 may be formed as a conductive layer above the address line test circuits 513 (e.g., the test address decoder circuits) in the scribe region 112 and the one of the memory access circuits 504 (e.g., one of the row drivers and sense amplifiers) in the memory array region 501 of the semiconductor chip 104.

The test address decoder circuits in the address line test circuits 513 may decode the test address signals received at the test address pads, and activate one or more address control lines of the address control lines 520 responsive to a decoding result of the test address signals by applying a voltage corresponding to the test voltage at a timing responsive to the test command signals.

Electrical characteristics of the memory arrays 503, including the memory access transistors 533 and the address lines coupled to the memory access transistors 533 may be analyzed by the address line test circuits 513. For example, by providing test voltages on address control lines 520 coupled to the memory access transistors 533 through the memory access circuits 504, emission analysis may be performed to detect, for example, locations of leak currents in proximity to the address control lines 520 and the memory access transistors 533. The electrical characteristics may be tested and analyzed without forming capacitors 534 of memory cells, a BEOL above the capacitors 534 and/or a back end above the BEOL including address pads 550 for identifying an address of a memory cell to be accessed in the memory arrays 503. In some embodiments, the back end may include a wiring layer, and the address pads 550 may be disposed on the wiring layer.

Figure 6:
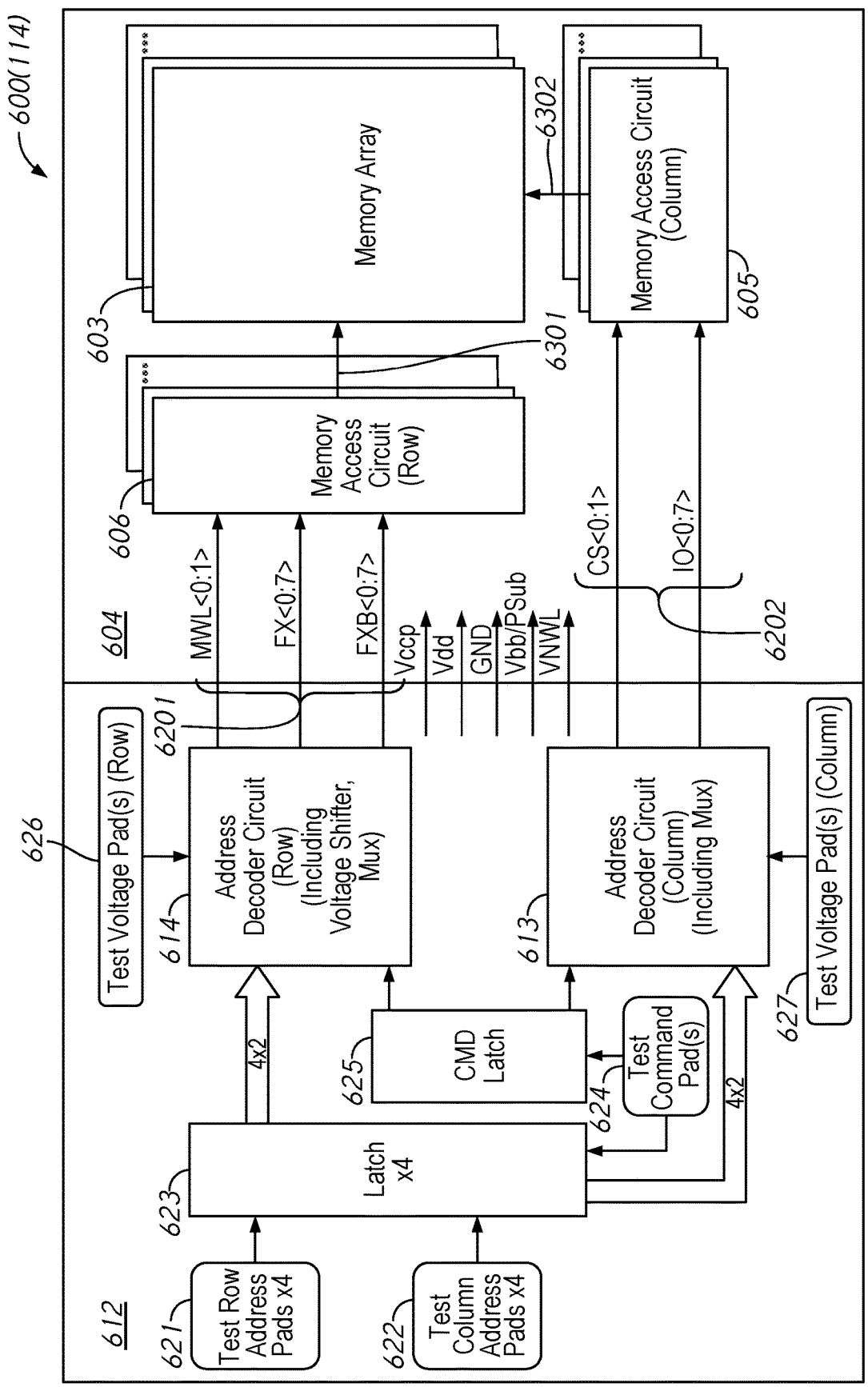
FIG. 6 is a schematic diagram of a chip and a scribe region in a semiconductor device in accordance with an embodiment of the present disclosure.

FIG. 6 is a schematic diagram of circuits included in a semiconductor chip 604 and a scribe region 612 in a structure 600 in accordance with an embodiment of the present disclosure. In some embodiments, the structure 600 may be included in the portion 114 of FIG. 1 and/or the structure 500 of FIG. 5. The following description uses a dynamic random-access memory (DRAM) as an illustrative example of the semiconductor chip 604.

The semiconductor chip 604 includes memory arrays 603. In some embodiments, the memory arrays 603 may be the memory arrays 503 in the memory array region 501 of FIG. 5. Each of the memory arrays 603 may include memory access transistors, such as memory access transistors 533 of FIG. 5. In some embodiments, the semiconductor chip 604 may include memory access circuits 606 and 605 disposed adjacent the memory arrays 603. In some embodiments, the memory access circuits 606 may be the memory access circuits 504 in the memory array region 501. In some embodiments, the memory access circuit 606 may include row drivers. In some embodiments, the memory access circuit 605 may include a portion of sense amplifiers to be formed with the memory access transistors.

The scribe region 612 includes address decoder circuits 614 and 613. The scribe region 612 may also include test row address pads 621, test column address pads 622, an address latches 623, test command pads 624, command latches 625, and test voltage pads 626 and 627.

The test command pads 624 may receive test command signals that control the timings of when row address signals or column address signals are received. The test command pads 624 may be coupled to the address latches 623. The test command pads 624 may also be coupled to the command latches 625. Thus, the address latches 623 and the command latches 625 may receive the test command signals. The command latches 625 may provide the address decoder circuits 614 and 613 with test row command signals and test column command signals respectively responsive to the test command signals.

The test row address pads 621 and test column address pads 622 may receive test row address signals and test column address signals at respective test row address pads 621 and test column address pads 622. The address latches 623 may receive the test row address signals and the test column address signals from the test row address pads 621 and the test column address pads 622. In some embodiments, the address latches 623 may receive a set of the test row address signals and the test column address signals. The address latches 623 may provide the test row address signals and the test column address signals to the address decoder circuits 614 and 613 respectively, responsive to the test command signals from the test command pads 624.

The address decoder circuit 614 may receive the test row address signals latched by the address latches 623. The address decoder circuit 614 may decode the test row address signals responsive to the test command signal. In some embodiments of the disclosure, a number of the test row address signals from the test row address pads latched by the address latches 623 is four. In other embodiments, the test address signals may include greater or fewer signals. The address decoder circuit 614 may further include a voltage shifter circuit that may adjust a voltage of a row address line to be activated. The address decoder circuit 614 may be coupled to row address control lines 6201 that are coupled to the memory access circuit 606. In some embodiments, the address control lines 420 and/or the address control lines 520 may include the row address control lines 6201. The address decoder circuit 614 is configured to activate one or more row address control signals on one or more corresponding row address control lines among the row address control lines responsive to the decoding result of the test row address signals. In some embodiments, the row address control lines 6201 may provide row address control signals. For example, the row address control lines 6201 may include main word lines MWL<0:1>, and sub word lines FX<0:7> and FXB<0:7>. The main word lines MWL<0:1> may provide control signals to control main word drivers, and the sub word lines FX<0:7> and FXB<0:7> may provide control signals to control sub word drivers. The memory access circuit 606, such as row drivers, may activate one or more row address lines 6301 among row address lines 6301 coupled to the memory array 603 responsive to the row address control signals from the address decoder circuit 614. In some embodiments, a number of the row address lines 6301 coupled to the memory arrays 603 is greater than the number of the test row address signals. Similarly, a number of the row address control lines 6201 may be greater than the number of the test row address signals. For example, where the test row address signals include four signals, a number of the row address lines 6301 is sixteen and a number of the row address control lines 6201 is eighteen. In other embodiments of the disclosure, the row address lines 6301 and/or the row address control lines 6201 may include greater or fewer lines.

The test voltage pad 626 may receive a test voltage to be applied on one of the row address control lines 6201. The test voltage may be used to detect a location of a leak current or testing some other electrical characteristics of circuits within the memory arrays 603. The test voltage may have a magnitude appropriate to meet a purpose of a test. In some examples, the test voltage may range from a power supply voltage VSS at a ground level to a positive power supply voltage VDD. In other examples, the test voltage may range from a negative power supply voltage that is lower than the ground level to a positive power supply voltage that is higher than the positive power supply voltage VDD.

In some embodiments, the address decoder circuit 614 may receive the test voltage from the test voltage pad 626. The address decoder circuit 614 may provide the test voltage to one of the row address control lines 6201 responsive to an active state of a corresponding test row address signal. In some embodiments, the address decoder circuit 614 may include a multiplexer. For example, when the scribe region 612 includes four test row address pads 621 that receive the four corresponding test row address signals, the address decoder circuit 614 may provide the test voltage on one or more row address control lines 6201. The memory access circuit 606 may provide the test voltage to activate every sixteenth row address lines 6301 coupled to the memory arrays 603 corresponding to the test row address signals responsive to the test voltage on the one or more row address control lines 6201.

The address decoder circuit 613 may receive the test column address signals latched by the address latch 623. The address decoder circuit 613 may decode the test column address signals responsive to the test command signal. As previously described, for the present example, the test column address signals from the test column address pads latched by the address latch 623 include four signals. However, in other embodiments disclosure, the test column address signals may include greater or fewer signals. The address decoder circuit 613 may be coupled to column address control lines 6202 that are coupled to the memory access circuit 605. In some embodiments, the address control lines 420 and/or the address control lines 520 may include the column address control lines 6202. The address decoder circuit 613 is configured to activate one or more column address control signals on one or more corresponding column address control lines 6202 among the column address control lines 6202 responsive to the decoding result of the test column address signals. In some embodiments, the column address control lines 6202 may provide column address control signals. For example, the column address control lines 6202 may include column select lines CS<0:1> and input/output lines IO<0:7>. The column select lines CS<0:1> and the input/output lines IO<0:7> may provide control signals from the address decoder circuit 613 to the memory access circuit 605. The memory access circuit 605, such as a portion of sense amplifiers, may activate one or more column address lines 6302 among column address lines 6302 coupled to the memory array 603 responsive to the column address control signals from the address decoder circuit 613. In some embodiments, a number of the column address lines 6302 coupled to the memory arrays 603 is greater than the number of the test column address signals. For example, where the test column address signals include four signals, a number of the column address lines 6302 is sixteen and a number of the column address control lines 6202 is ten. In other embodiments of the disclosure, the column address lines 6302 may include greater or fewer column address lines and the number of column address control lines 6202 may include greater or fewer column address control lines.

The test voltage pad 627 may receive a test voltage to be applied on one of the column address control lines 6202. The test voltage may be used to detect a location of a leak current or testing some other electrical characteristics of circuits within the memory arrays 603. The test voltage may have a magnitude appropriate to meet a purpose of a test. In some examples, the test voltage may range from a power supply voltage VSS at a ground level to a positive power supply voltage VDD. In other examples, the test voltage may range from a negative power supply voltage that is lower than the power supply voltage VSS to a positive power supply voltage that is higher than the positive power supply voltage VDD.

In some embodiments, the address decoder circuit 613 may receive the test voltage from the test voltage pad 627. The address decoder circuit 613 may provide the test voltage to one of the column address control lines 6202 responsive to an active state of a corresponding test column address signal. In some embodiments, the address decoder circuit 613 may include a multiplexer. For example, when the scribe region 612 includes four test column address pads 622 that receive the four corresponding test column address signals, the address decoder circuit 613 may provide the test voltage on one or more column address control lines 6202. The memory access circuit 605 may provide the test voltage to activate every sixteenth column address lines 6302 coupled to the memory arrays 605 corresponding to the test column address signals responsive to the test voltage on the one or more column address control lines 6202.

A number of row or column address lines coupled to a memory array may be greater (e.g., $2^N$ lines for row or column address lines, where N is a natural number) than a number of row or column address lines (e.g., N lines) coupled to the test row or column address pads (e.g., N address pads for the test row or column address pads). An emission analysis of row and column address lines by activation of every $2^N$th address lines coupled to address decoder circuits may identify a defective address line which may not be identified by an emission analysis of address lines by activation of Nth address lines directly coupled to test address pads. A defective location in a test memory array may be detected by an emission analysis by including address decoder circuits and a relatively lower number of address pads in an FEOL of the scribe region, without providing a capacitor of a memory cell and a BEOL.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus comprising:
   a first semiconductor chip and a second semiconductor chip, adjacent to one another;
   a scribe region between the first and second semiconductor chips;
   test address pads in the scribe region, the test address pads configured to receive address signals; and
   an address decoder circuit in the scribe region, the address decoder configured to provide first signals responsive to the address signals from the test address pads;
   a memory access circuit configured to provide second signals responsive to the first signals; and
   a plurality of memory access transistors, wherein at least one memory access transistor of the plurality of memory access transistors is activated responsive to the second signals.

2. The apparatus of claim 1, wherein the plurality of memory access transistors are in the scribe region.

3. The apparatus of claim 1, wherein the plurality of memory access transistors are in the first semiconductor chip.

4. The apparatus of claim 1, further comprising address pads in the first semiconductor chip, wherein the address pads are disposed above the test address pads.

5. The apparatus of claim 1, wherein the memory access circuit comprises a row driver circuit.

6. The apparatus of claim 1, wherein the memory access circuit comprises a sense amplifier circuit.

7. The apparatus of claim 1, further comprising a plurality of address control lines, wherein the plurality of address control lines are disposed across the first semiconductor chip and the scribe region.

8. The apparatus of claim 7, wherein the plurality of address control lines are disposed above the memory access transistors.

9. A method of forming a semiconductor device, comprising:
   forming a substrate;
   forming on the substrate a first semiconductor chip and a second semiconductor chip adjacent to one another;
   forming on the substrate a scribe region between the first semiconductor chip and the second semiconductor chip, the scribe region including an address decoder circuit;
   forming a memory access circuit in the first semiconductor chip; and
   forming a plurality of address control lines across the scribe region and the first semiconductor chip, wherein each address control line of the plurality of address control lines has one end coupled to the memory access circuit in the first semiconductor chip and another end coupled to the address decoder circuit in the scribe region.

10. The method of claim 9, further comprising forming the address decoder circuit, the memory access circuit coupled to the address decoder circuit, and memory access transistors coupled to the memory access circuit concurrently.

11. The method of claim 10, wherein forming the memory access transistors comprises:
   forming the memory access transistors in the scribe region.

12. The method of claim 9, further comprising forming memory access transistors coupled to the memory access circuit in the first semiconductor chip.

13. The method of claim 12, further comprising forming a conductive layer including the address control lines across the scribe region and the first semiconductor chip.

14. The method of claim 13, wherein forming the conductive layer including the address control lines comprises:
   forming the address control lines above the address decoder circuit and the memory access circuits.

15. A method comprising:
   receiving address signals at address pads in a scribe region adjacent to a chip;
   decoding the address signals at an address decoder circuit in the scribe region; and
   activating address control lines among a plurality of address control lines responsive to a decoding result of the address signals, wherein
   a number of the plurality of address control lines is greater than a number of the address signals.

16. The method of claim 15, further comprising:
   activating address lines among a plurality of address lines responsive to activation of the address control lines; and
   activating memory access transistors among a plurality of memory access transistors responsive to activation of the address lines.

17. The method of claim 16, wherein the plurality of memory access transistors are disposed in the scribe region.

18. The method of claim 16, wherein the plurality of memory access transistors are disposed in the chip.

19. The method of claim 16, wherein activating the one or more address lines is performed by either a row decoder or a sense amplifier coupled to the corresponding memory access transistor of the plurality of memory access transistors in the chip.

20. An apparatus comprising:
   a semiconductor chip;
   a scribe region outside the semiconductor chip;
   address pads in the semiconductor chip; and
   test address pads in the scribe region, the test address pads configured to receive address signals;
   wherein the address pads are disposed in a layer above the test address pads.

21. The apparatus of claim 20, further comprising:
   a front end of line including a first wiring layer; and
   a back end above the front end of line, the back end including a second wiring layer,
   wherein the test address pads are disposed on the first wiring layer, and the address pads are disposed on the second wiring layer.

22. The apparatus of claim 21, further comprising an address decoder configured to receive the address signals, wherein wirings included in the test address pads and the address decoder and wirings coupled to the test address pads and further coupled to the address decoder are disposed on the first wiring layer or under the first wiring layer.

23. A method of forming a semiconductor device, comprising:
   forming a substrate;
   forming a first wiring layer on the substrate; and
   forming a second wiring layer above the first wiring layer,
   wherein the first wiring layer comprises test address pads configured to receive test address signals, and
   wherein the second wiring layer comprises address pads configured to receive address signals.

24. The method of claim 23, further comprising:
   forming an address decoder configured to receive the address signals,
   forming wirings included in the test pads and the address decoder and wirings coupled to the test pads and to the address decoder while forming the first wiring layer or before forming the first wiring layer.

* * * * *